(12) United States Patent
Perkins et al.

(10) Patent No.: US 10,964,864 B2
(45) Date of Patent: Mar. 30, 2021

(54) MICRO LED MIXING CUP

(71) Applicant: Apple Inc., Cupertino, CA (US)

(72) Inventors: James Michael Perkins, Mountain View, CA (US); Sergei Y. Yakovenko, Pleasanton, CA (US); Dmitry S. Sizov, Cupertino, CA (US)

(*) Notice: Subject to any disclaimer, the term of this patent is extended or adjusted under 35 U.S.C. 154(b) by 0 days.

(21) Appl. No.: 16/546,046

(22) Filed: Aug. 20, 2019

(65) Prior Publication Data

US 2019/0371987 A1 Dec. 5, 2019

Related U.S. Application Data

(62) Division of application No. 15/842,603, filed on Dec. 14, 2017, now Pat. No. 10,431,723.

(60) Provisional application No. 62/452,902, filed on Jan. 31, 2017.

(51) Int. Cl.
| | | |
|---|---|---|
| *H01L 33/60* | (2010.01) | |
| *H01L 33/42* | (2010.01) | |
| *H01L 33/48* | (2010.01) | |
| *H01L 25/075* | (2006.01) | |
| *H01L 33/20* | (2010.01) | |
| *H01L 33/52* | (2010.01) | |
| *H01L 33/62* | (2010.01) | |

(52) U.S. Cl.
CPC ............ *H01L 33/60* (2013.01); *H01L 33/42* (2013.01); *H01L 33/483* (2013.01); *H01L 25/0753* (2013.01); *H01L 33/20* (2013.01); *H01L 33/52* (2013.01); *H01L 33/62* (2013.01); *H01L 2933/0091* (2013.01)

(58) Field of Classification Search
CPC ......... H01L 33/02; H01L 33/06; H01L 33/08; H01L 33/10; H01L 33/20; H01L 33/60; H01L 33/38; H01L 33/387; H01L 33/483; H01L 33/486; H01L 33/42; H01L 33/46; H01L 33/52; H01L 33/58; H01L 33/62; H01L 33/644; H01L 25/0753; H01L 25/167; H01L 2933/0016; H01L 2933/0025; H01L 2933/005; H01L 2933/0058; H01L 2933/0066; H01L 2933/0091; H01L 27/322; H01L 27/3246; H01L 2224/05551; H01L 2224/05567; H01L 2224/05571; H01L 2224/05572; H01L 2224/05578; H01L 2924/161; H01L 2924/16153; H01L 2924/1617; H01L 2924/16235; H01L 2924/16; H01L 2924/16588; H01L 2924/181; H01L 2924/1815; H01L 2924/18165
USPC ......... 257/88, 89, 98, 99, E33, 59, E33.067; 438/27
See application file for complete search history.

(56) References Cited

U.S. PATENT DOCUMENTS

| | | |
|---|---|---|
| 7,980,743 B2 | 7/2011 | Loh |
| 8,531,387 B2 | 9/2013 | Park et al. |
| 8,999,736 B2 | 4/2015 | Hsieh |
| 9,484,504 B2 | 11/2016 | Bibi et al. |

(Continued)

*Primary Examiner* — Natalia A Gondarenko
(74) *Attorney, Agent, or Firm* — Jaffery Watson Mendonsa & Hamilton LLP

(57) ABSTRACT

A light emitting structure including mixing cups are described. In an embodiment, a light emitting structure includes a light emitting diode (LED) bonded to a substrate, a diffuser layer adjacent the LED, an angular filter directly over the diffuser layer and the LED, and an overcoat layer directly over the angular filter and the LED.

15 Claims, 9 Drawing Sheets

(56) References Cited

U.S. PATENT DOCUMENTS

| | | | |
|---|---|---|---|
| 10,304,813 B2 * | 5/2019 | Kuo | ........................ H01L 33/56 |
| 2009/0296389 A1 | 12/2009 | Hsu | |
| 2011/0001148 A1 | 1/2011 | Sun | |
| 2011/0198644 A1 | 8/2011 | Hwang | |
| 2013/0001605 A1 | 1/2013 | Ishihara | |
| 2014/0159064 A1 * | 6/2014 | Sakariya | ................ H01L 33/44 |
| 2015/0331285 A1 | 11/2015 | Bibi | |
| 2017/0062674 A1 | 3/2017 | Kwon | |
| 2017/0104141 A1 | 4/2017 | Park | |
| 2017/0331016 A1 * | 11/2017 | Tchoul | .................... H01L 33/56 |
| 2018/0019384 A1 * | 1/2018 | Abe | ........................ H01L 33/54 |

\* cited by examiner

MICRO LED MIXING CUP

RELATED APPLICATIONS

This application is a divisional of co-pending U.S. patent application Ser. No. 15/842,603 filed Dec. 14, 2017, which claims the benefit of priority of U.S. Provisional Application No. 62/452,902 filed Jan. 31, 2017, both of which are incorporated herein by reference.

BACKGROUND

Field

Embodiments described herein relate to light emitting devices. More particularly, embodiments relate to structures to facilitate light extraction.

Background Information

State of the art displays for phones, tablets, computers, and televisions utilize glass substrates with thin film transistor (TFTs) to control transmission of backlight though pixels based on liquid crystals. More recently emissive displays such as those based on organic light emitting diodes (OLEDs) have been introduced as being more power efficient, and allowing each pixel to be turned off completely when displaying black. Even more recently, it has been proposed to incorporate emissive inorganic semiconductor-based micro LEDs into high resolution displays. Compared to OLEDs, inorganic semiconductor-based micro LEDs may be more energy efficient and also may not be prone to lifetime degradation and extreme sensitivity to moisture.

DETAILED DESCRIPTION

Figure 1:
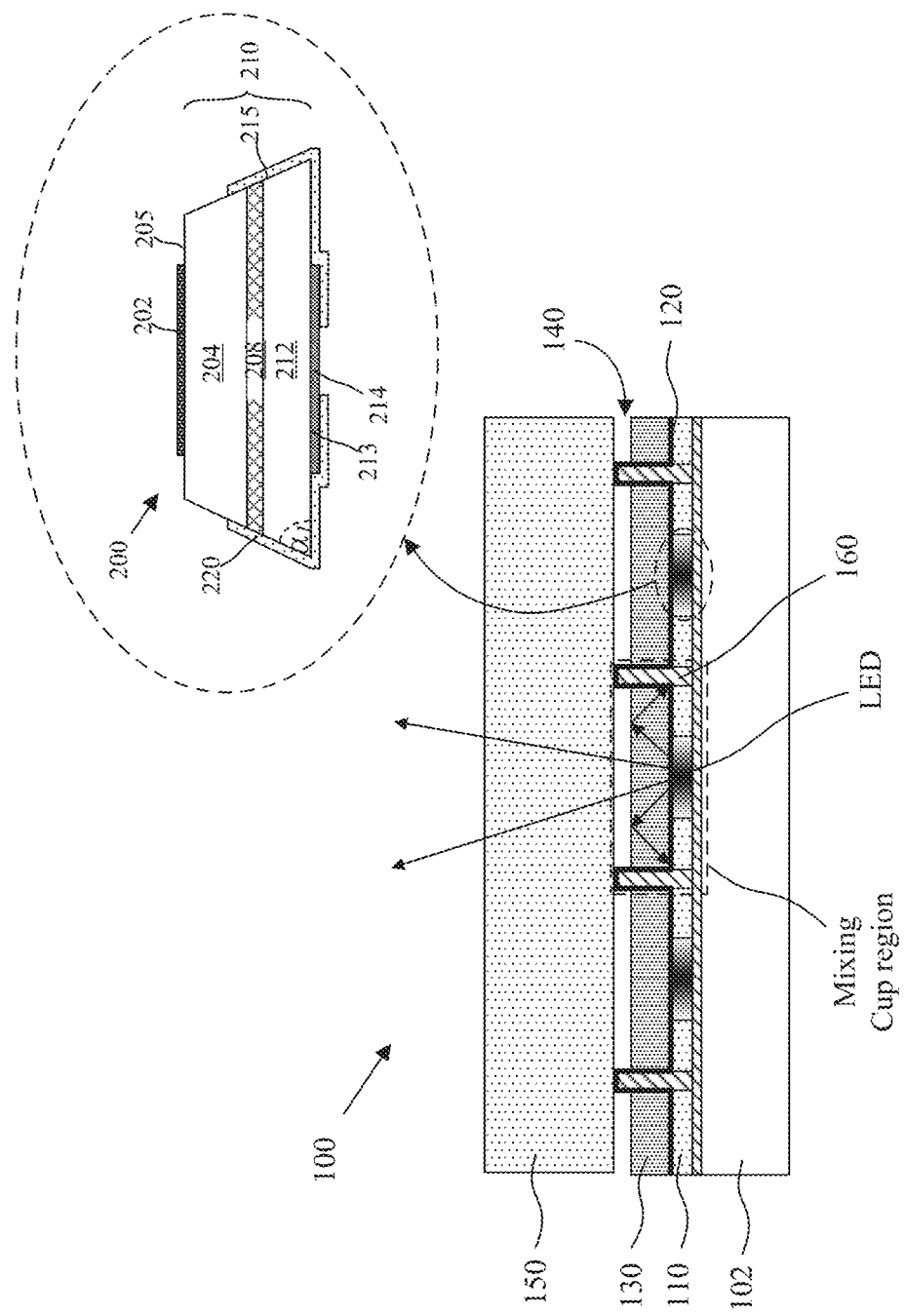
FIG. 1 is a schematic cross-sectional side view illustration of light emitting structure including a plurality of mixing cup regions in accordance with an embodiment.

Embodiments describe light emitting devices and structures to facilitate light extraction. Specifically, embodiments describe LED mixing cup structures (e.g. micro LED mixing cup structures) to confine light propagation to a small area, where the losses in the system can be controlled, and light extraction increased.

It has been observed that there may be significant optical loss within the optical path of an LED within a micro LED display system which contributes to a reduced light extraction efficiency of the system, and thus a reduced external quantum efficiency (EQE) of the micro LED display system. In particular, it has been observed that light is often extracted from the micro LEDs into the surrounding films. For example, much of the light exiting the micro LEDs is wave guided within a sidewall passivation layer and ultimately absorbed by materials in the backplane. Additionally, light exiting the micro LEDs may be trapped and lost by total internal reflection (TIR) within overcoat layers (e.g. passivation or planarization layer, color filter, polarizer, cover) in the display system.

In an exemplary system, a micro LED may be laterally surrounded with a transparent sidewall passivation layer such as an acrylic, and topped with an overcoat layer formed of a similar material. For example, the sidewall passivation layer and overcoat layer may each be characterized by an index of refraction (n) of approximately 1.5. It has been observed that light emitted from a micro LED may be trapped by the overcoat layer interface with the ambient (air) by TIR effect determined by Snell's law. The trapped portion of light reflects down and may absorbed by a black matrix layer, or other material in the material stackup. The TIR cutoff angle has been observed to be approximately 45 degrees, determined by the relationship a $\sin(1/n)$, with n the index of refraction of the overcoat layer. However, light may also be trapped by other film features or interfaces within the display stackup, and may also be lost through absorption. In accordance with embodiments, LED mixing cup structures are described to increase light extraction, and reduce transmission loss due to TIR.

In one aspect, a mixing cup structure in accordance with embodiments may include a diffuser layer adjacent the LED. The diffuser layer may include scattering particles dispersed in a matrix. In accordance with embodiments, the diffuser layer may replace the sidewall passivation layer, or be formed over the sidewall passivation layer. In such a structure, the propagation length of light between scattering events may be quite small, giving the light emitted from the LED opportunity to be extracted. Exemplary diffuser layers may be formed of optical materials filled with scattering particles. Exemplary diffuser layers can be low index layers, high index layers, or share a same index of refraction as an overcoat layer or sidewall passivation layer.

In another aspect, a mixing cup structure in accordance with embodiments may include an angular filter directly over the diffuser layer and the LED. Exemplary angular filters include a low index volume characterized by an index of refraction less than 1.1, distributed Bragg reflector (DBR) structure or other specialized optical film. Exemplary low index volumes may include a void such as a vacuum, air gap, or other inert gas-filled region, or a low index matrix. In such a configuration, the angular filter counteracts the tendency of light to otherwise be trapped by overcoat layer interfaces by TIR effect. More specifically, in accordance with embodiments the angular filter (e.g. void, etc.) only permits light to first escape beyond the angular filter that can then escape the full overcoat film stack in the display. Thus, the light that has no chance of escaping the display is reflected back into the mixing cup area where it can be scattered once more into a mode which may then escape.

Simulation data suggests that mixing cup structures in accordance with embodiments may not only increase light extraction, such systems may also naturally induce a Lambertion profile to the emitted light, increase on axis light for sub-Lambertion emitting systems, and also make color matching for observation angles easier.

In accordance with embodiments, a mixing cup structure includes an LED bonded to a substrate, a diffuser layer adjacent the LED, and an angular filter directly over the diffuser layer and the LED. A sidewall passivation layer may optionally laterally surround the LED and beneath the diffuser layer. In accordance with some embodiments the sidewall passivation is formed of the same material as the diffuser layer. In accordance with embodiments, the mixing cup structure may additionally include a well structure including a well opening within which the LED is bonded. The diffuser layer, and optional sidewall passivation layer, may be located adjacent the LED within the well opening. The well structure may additionally be reflective to the LED emission spectrum.

In accordance with some embodiments, a mixing cup structure includes an LED mounted with the well opening with reflective sidewall surfaces that re-direct the emitted light upward with an angle sufficient to be directed within an escape cone, such that the light does not undergo TIR. Scattering particles of the diffuser layer within the well openings may redirect the light and control emission angular characteristics. The angular filter may separate the LED and diffuser layer from the overcoat layers in order to prevent light that is tilted by more than the TIR cutoff angle from leaving the well to the overcoat media where it would be trapped and lost. Thus, the angular filter keeps light confined within the well opening until it is re-directed to a sufficiently steep angle (e.g. the escape cone) which allows such light to escape the display system to ambient.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "over", "to", and "on" as used herein may refer to a relative position of one layer with respect to other layers. One layer directly "over" a layer is located directionally over, as opposed to above yet not over (e.g. diagonal). One layer "over", "directly over", or "on" another layer or bonded "to" or in "contact" with another layer may be directly in contact with the other layer or may have one or more intervening layers. One layer between layers may be directly in contact with the layers or may have one or more intervening layers.

FIG. 1 is a schematic cross-sectional side view illustration of a light emitting structure including a plurality of mixing cup regions in accordance with an embodiment. As shown, LEDs 200 are mounted on the substrate 102, and optionally within a well structure 160, which may optionally be reflective. A dielectric sidewall passivation layer 110 is optionally deposited to laterally surround the LEDs 200. A transparent electrode layer 120 is then deposited on top of the LEDs 200 to complete the electrical circuits. A diffuser layer 130, including scattering particles dispersed within a matrix, is then deposited on top of the LEDs 200 using a suitable technique such as spin casting, slot die coating, or other polymer film deposition technique. An angular filter 140 is then formed over the diffuser layer 130 and the LEDs 200. The angular filter 140 can be formed in a variety of different manners depending upon application. In an embodiment, the angular filter 140 is a low index volume characterized by an index of refraction less than 1.1. For example, the angular filter 140 may be a low index matrix material, or a void. For example, the void may be an air gap, or filled with an inert gas, or vacuum. In an embodiment, the angular filter 140 is a distributed Bragg reflector (DBR) layer.

The sidewall passivation layer 110 may be formed using a variety of techniques. For example, sidewall passivation layer can be slot coated, slit coated, or spin coated on the substrate 102. Sidewall passivation layer 110 can be formed using other techniques such as ink jetting, physical vapor deposition (PVD) or chemical vapor deposition (CVD). The sidewall passivation layer 110 may additionally provide step coverage for the deposition of a top electrode layer 170 such as indium tin oxide (ITO) or poly(3,4-ethylenedioxythiophene (PEDOT). The passivation layer 110 may perform a variety of functions, including securing the LEDs 200 onto the substrate 102, passivating sidewalls of the LEDs 200 to protect against shorting between doped layers, and acting as a leveling surface for the formation of the transparent electrode layer 120 such as indium tin oxide (ITO) or poly(3,4-ethylenedioxythiophene (PEDOT).

In an embodiment, sidewall passivation layer 110 is formed of a thermoset material for example, an acrylic such as poly(methyl methacrylate) (PMMA), benzocyclobutene (BCB), epoxy, etc. An exemplary PMMA material may have a refractive index of approximately 1.5. Sidewall passivation layer 110 may also be formed of a higher index material. For example, the sidewall passivation layer 110 may be formed of any of the above mentioned polymers filled with high refractive index nanoparticles, such as with Zr-oxide nanoparticles. In an embodiment, the sidewall passivation layer 110 includes a polymer matrix filled with Zr-oxide nanoparticles, and the sidewall passivation layer 110 is characterized by an index of refraction of approximately 1.76.

The diffuser layer 130 may be formed of similar materials as the sidewall passivation layer. The diffuser layer 130 may include a dispersion of scattering particles. A variety of scattering particles may be used, including metal oxides, and non-conductive materials. For example, an exemplary scattering particle may be $TiO_2$. In an embodiment, average particle size is between 100 nm and 500 nm, or more specifically between 100 nm and 250 nm. In an embodiment, the diffuser layer is a high index layer, for example, and may be filled with high refractive index nanoparticles, such as with Zr-oxide nanoparticles, in addition to scattering particles.

In accordance with some embodiments, the diffuser layer 130 and the sidewall passivation layer 110 may be formed of the same material. For example, they may both be formed of the same polymer, and include the same scattering particles. Thus, the sidewall passivation layer 110 may optionally function as a diffuser layer.

An overcoat layer 150 including one or more optional optical films for the remainder of the display can then be applied, for example over the well structure 160, using suitable techniques. The films forming the overcoat layer 150 may be deposited, laminated, or a hard glass film can be sealed on top of the structure. For example, this can take place in a nitrogen, argon, or vacuum environment to ensure the inert nature of a void as the angular filter 140. In an embodiment, the overcoat layer 150 stack including black matrix layer, color filters, polarizers and thin cover glass, etc. could be integrated together and then laminated on top of the well as a whole, with the cover glass providing the needed rigidity.

In accordance with embodiments, the LEDs may be formed of inorganic semiconductor-based materials. In accordance with embodiments, the LEDs may be micro LEDs with maximum lateral dimensions between sidewalls of 1 to 300 µm, 1 to 100 µm, 1 to 20 µm, or more specifically 1 to 10 µm, such as 5 µm. In the following description the exemplary LEDs may be designed for emission of a variety of primary wavelengths, such as a primary red light (e.g. 620-750 nm wavelength), primary green light (e.g. 495-570 nm wavelength), or primary blue light (e.g. 450-495 nm wavelength), though embodiments are not limited to these exemplary emission spectra. The LEDs may be formed of a variety of compound inorganic semiconductors having a bandgap corresponding to a specific region in the spectrum. For example, the LEDs can include one or more layers based on II-VI materials (e.g. ZnSe) or III-V materials including III-V nitride materials (e.g. GaN, AlN, InN, InGaN, and their alloys), III-V phosphide materials (e.g. GaP, AlGaInP, and their alloys), and III-V arsenide alloys (AlGaAs).

The LEDs 200 can include a variety of configurations depending upon application. Generally, the LEDs includes include a p-n diode 210 that includes a top region (e.g. layer) 204 doped with a first dopant type (e.g. n-doped), a bottom region (e.g. layer) 212 doped with a second, and opposite, dopant type (e.g. p-doped), and an active region (e.g. layer) 208 between the top region 204 and the bottom region 212. For example, the active region 208 may be a single quantum well (SQW) or multi-quantum well (MQW) layer including alternating quantum well layers and barrier layers. Additional layers may optionally be included in LED. For example, cladding layers may be formed on opposite sides of the active region 208 to confine current within the active region 208 and may possess a larger bandgap than the active region 208. Cladding layers may be doped to match the doping of the adjacent top and bottom regions 204, 212, or undoped. In other embodiments, the doping in the top and bottom regions 204, 212 is reversed.

In accordance with embodiments, the LEDs 200 can additionally include a top conductive contact 202 formed on a top side 205 of the p-n diode 210, and a bottom conductive contact 214 formed on a bottom side 213 of the p-n diode 210. In an embodiment, the bottom conductive contact 214 is formed of a conductive oxide, such as indium-tin-oxide (ITO) with a thickness of 500-1,000 angstroms, and may facilitate the formation of an ohmic contact with the bottom region 212. In an embodiment, bottom conductive contact 214 may include a metal layer or metal stack. For example, the bottom conductive contact 214 may include a metal stack of Pt/Au/Ni. In accordance with embodiment, the top conductive contact 202 includes a thin metal layer or layer stack. Top conductive contacts 202 may also be a conductive oxide such as indium-tin-oxide (ITO), or a combination of one or more metal layers and a conductive oxide. For example, the top conductive contact 212 may include a Ge/Au stack. Where top conductive contacts 202 include metal, the thickness may be thin for transparency and reflectivity reasons. In an embodiment where to conductive contacts 202 are formed of a transparent material such as ITO, the conductive contacts may be thicker, such as 1,000 to 2,000 angstroms.

By way of example, in an embodiment the LED 200 is design for emission of red light, and the materials are phosphorus based. The followed listing of materials for red emission is intended to be exemplary and not limiting. For example, the layers forming the LED 200 may include AlInP, AlInGaP, AlGaAs, GaP, and GaAs. In an embodiment, top region 204 includes n-AlInP or n-AlGaInP, and bottom region 212 includes p-GaP or p-AlInP. Active region 208 may be formed of a variety of materials, such as but not limited to, AlGaInP, AlGaAs, and InGaP.

By way of example, in an embodiment, the LED 200 is designed for emission of blue or green light, and the materials are nitride based. The followed listing of materials for blue or green emission is intended to be exemplary and not limiting. For example the layers forming the LED 200 may include GaN, AlGaN, InGaN. In an embodiment, top region 204 includes n-GaN, and bottom region 212 includes p-GaN. Active region 208 may be formed of a variety of materials, such as but not limited to InGaN.

As shown, the LED 200 may include sidewalls 215, and optionally an insulating layer 220 formed along the sidewalls 215. For example insulating layer 220 may be formed of an oxide material such as $Al_2O_3$ or $SiO_2$ or nitride material such as $SiN_x$. Sidewalls 215 may be characterized by a sidewall angle ($\alpha_1$) to horizontal. Sidewall angles in accordance with embodiments, may additionally be selected to increase light extraction efficiency. In an embodiment, sidewall angle ($\alpha_1$) is illustrated as an acute angle (inwardly tilted), for example with 50-70 degrees, such as approximately 60 degrees. However, the sidewall angle ($\alpha_1$) can also be obtuse.

In accordance with embodiments the substrate 102 may be a thin film transistor (TFT) backplane fabricated using technologies such as polycrystalline silicon (poly-Si) and amorphous silicon (a-Si). The substrate 102 may include a single crystal active layer. In such a configuration, the pixel circuits may be fabricated using metal-oxide semiconductor field-effect transistor (MOSFET) processing techniques. The substrate 102 may be active matrix or passive matrix. The substrate 102 may be rigid or flexible. In some embodiments the substrate 102 may include redistribution lines, and the pixel circuits may be included in driver chips that are also bonded to or embedded within the substrate 102.

Figure 2A:
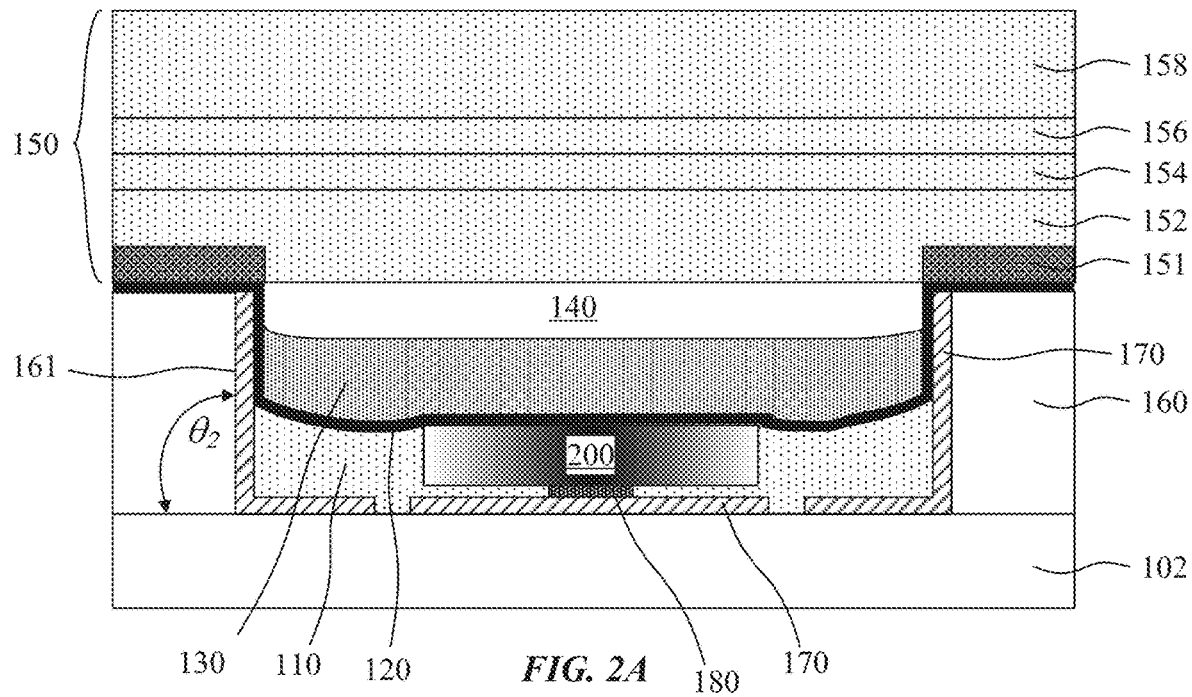
FIGS. 2A-2B are close-up cross-sectional side view illustrations of light emitting structures including LEDs mounted within well openings in accordance with embodiments.
Figure 2B:
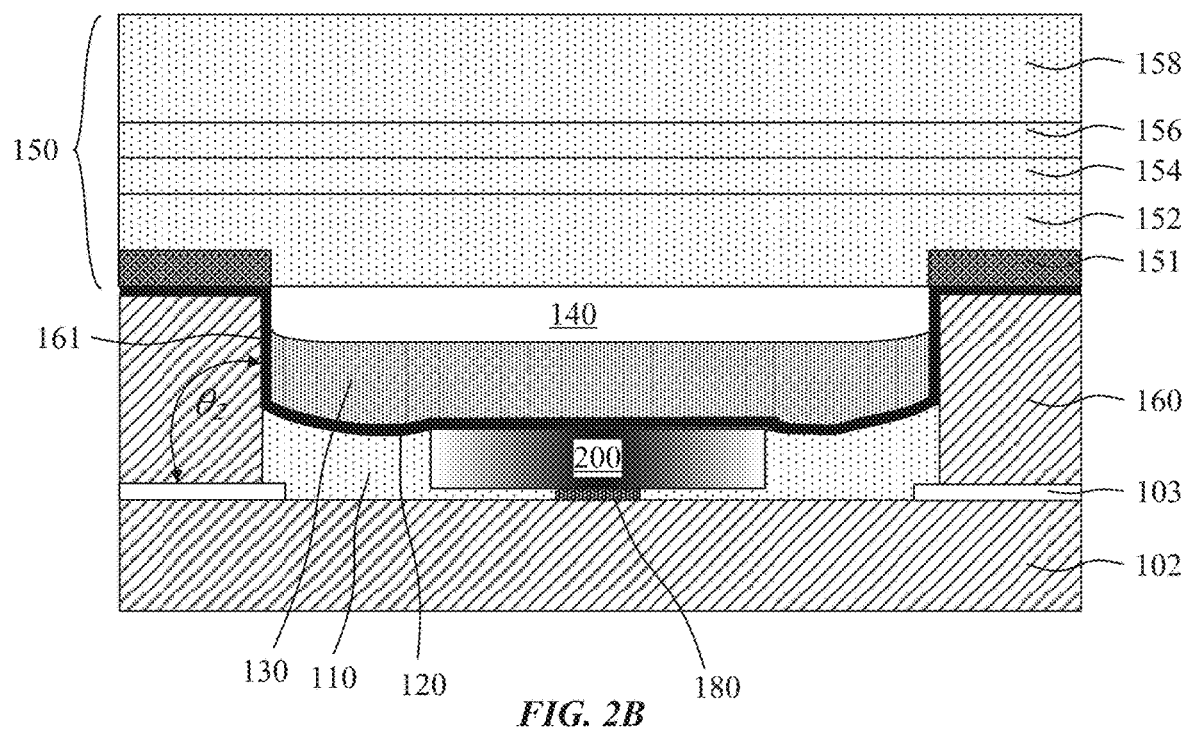

FIGS. 2A-2B are close-up cross-sectional side view illustrations of light emitting structures including LEDs mounted within well openings in accordance with embodiments. As illustrated, the light emitting structure may include an LED 200 bonded to a substrate 102 with a bonding material 180 (e.g. solder, metallic compound), a diffuser layer 130 adjacent the LED 200, an angular filter 140 (e.g. void) directly over the diffuser layer 130 and the LED 200, and an overcoat layer 150 directly over the angular filter 140 and the LED 200. In accordance with embodiments, exemplary angular filters 140 include a low index volume (e.g. void, matrix) characterized by an index of refraction less than 1.1 and a distributed Bragg reflector (DBR) layer. In the embodiments illustrated in FIGS. 2A-2B, the angular filter 140 is a void.

In accordance with embodiments, the overcoat layer 150 may include one or more films, which may be applied separately or together as a stack. A number of combinations are envisioned, including deposition and lamination of one or more combinations of films. In the particular embodiment illustrated in FIGS. 2A-2B, the overcoat layer includes a black matrix layer 151, passivation layer 152, color filter layer 154, polarizer layer 156 and cover layer 158 (such as a flexible or rigid glass). The black matrix layer 151 may be patterned to include openings that correspond to the well openings, or alternatively that correspond to mixing cup regions where wells are not formed. In accordance with embodiments, the passivation layer 152 may be formed of any of the materials as the sidewall passivation layer 110.

In accordance with embodiments, the LED 200 may be bonded to the substrate 102 within a well opening in a well structure 160. Additionally, the diffuser layer 130 may be adjacent the LED 200 within the well opening. FIGS. 2A-2B illustrate to exemplary well structures 160, though embodiments are not limited to these particular configurations. In the embodiment illustrated in FIG. 2A, one or more mirror layers 170 is formed along the sidewalls 161 and/or bottom surface of the well opening. In the embodiment illustrated in FIG. 2B, the well structure 160 and substrate 102 may be reflective. For example, they may be electrically insulated from one another with an insulating layer 103. A combination of mirror layers and reflective structures can be used. Suitable materials to form the mirror layers 170 and/or reflective well structure 160 or substrate 102 may include those reflective to the emissive wavelength spectrum of the LEDs 200, including but not limited to aluminum, gold, silver.

In accordance with embodiments, the well structure 160 sidewalls 161 that define the well openings may be characterized by a sidewall angle ($\alpha_2$) to horizontal. As illustrated, sidewall angles may be approximately vertical (90 degrees) or near vertical to minimize the footprint on the display. Angled sidewalls less than 90 degrees may potentially improve light output depending on the scattering agent concentration and the path length. In accordance with embodiments, the height of the well structures 160 may be greater than the height of the LEDs 200, for example, by 1-7 μm. In an embodiment, height (depth) of the well structures 160 is 5-10 μm.

In the exemplary embodiments illustrated in FIGS. 2A-2B, a sidewall passivation layer 110 laterally surrounds the LED 200 within the well opening of the well structure 160, and beneath the diffuser layer 130. In an embodiment, the sidewall passivation layer is formed of a transparent material. Exemplary materials include acrylic such as PMMA, BCB, epoxy, etc. An exemplary PMMA material may have a refractive index of approximately 1.5. Sidewall passivation layer 110 may also be formed of a higher index material. In such an embodiment, the sidewall passivation layer 110 may be characterized by an index of refraction that is greater than an index of refraction of a material forming the diffuser layer 130 matrix. For example, the sidewall passivation layer 110 may be formed of any of the above mentioned polymers filled with high refractive index nanoparticles, such as with Zr-oxide nanoparticles. In an embodiment, the sidewall passivation layer 110 includes a polymer matrix filled with Zr-oxide nanoparticles, and the sidewall passivation layer 110 is characterized by an index of refraction of approximately 1.76.

The sidewall passivation layer may additionally function as a leveling surface for the formation of the transparent electrode layer 120 such as indium tin oxide (ITO) or poly(3,4-ethylenedioxythiophene) (PEDOT). In the embodiments illustrated in FIGS. 2A-2B the transparent electrode layer 120 is on the LED 200, and the diffuser layer 130 is directly over the LED 200 and the transparent electrode layer 130 within the well opening of the well structure 160.

Figure 3:
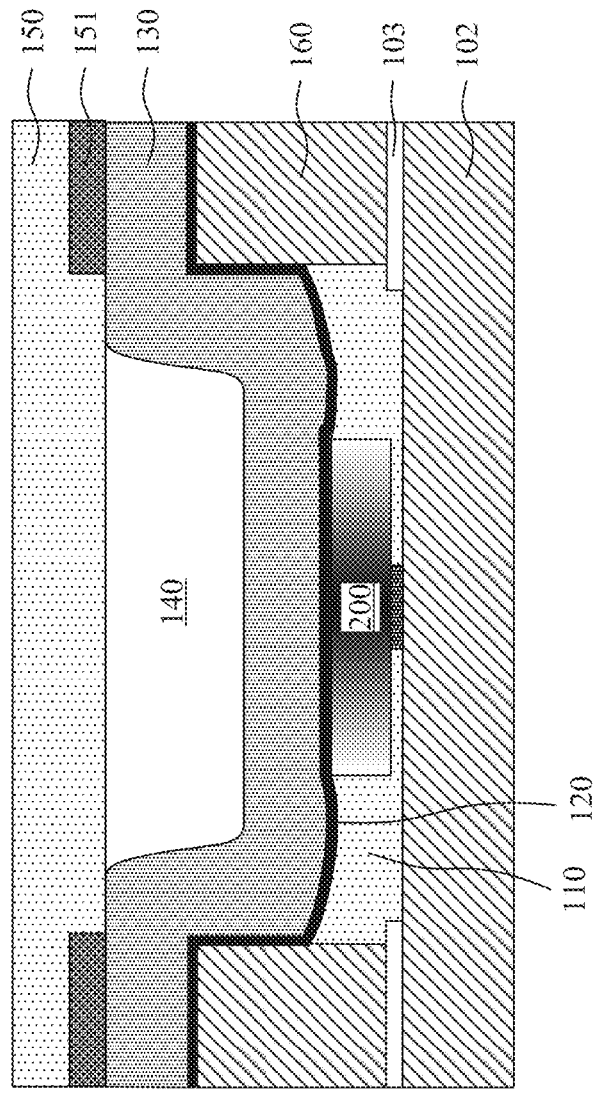
FIG. 3 is a close-up cross-sectional side view illustration of light emitting structure including a diffuser layer spanning over an LED and well structure in accordance with an embodiment.

In accordance with embodiments, the diffuser layer 130 may be applied individually within each corresponding well opening, across multiple well openings, or as a global layer across the display area. Referring now to FIG. 3 a close-up cross-sectional side view illustration is provided of light emitting structure in which the diffuser layer 130 is formed both on/over the top surface of the well structure 160 as well as within the well opening. In an embodiment, the diffuser layer 130 is conformal to the underlying structure an may also be used to form the void volume.

Figure 4A:
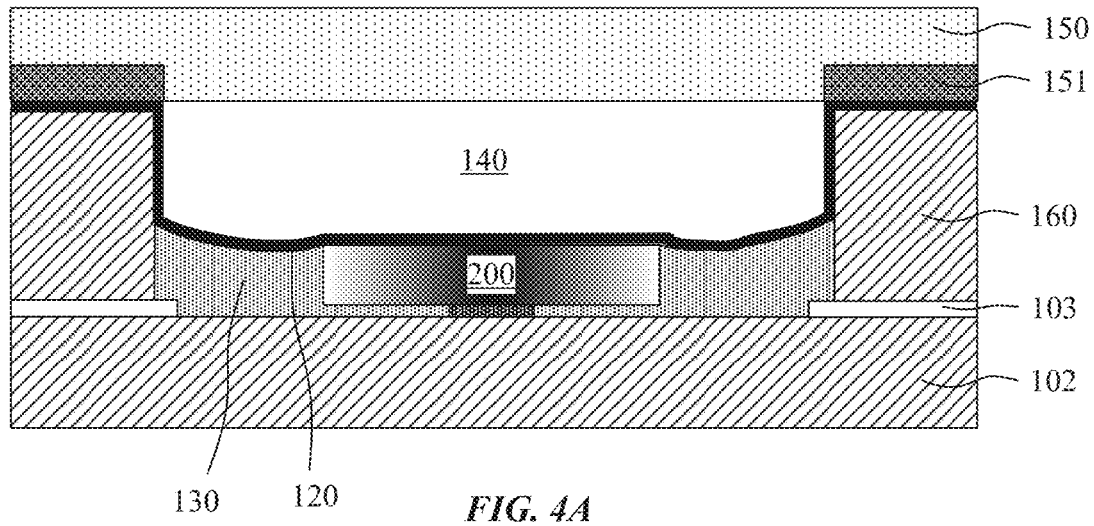
FIG. 4A is a close-up cross-sectional side view illustration of light emitting structure including a diffuser layer laterally adjacent to an LED within a well structure in accordance with an embodiment.
Figure 4B:
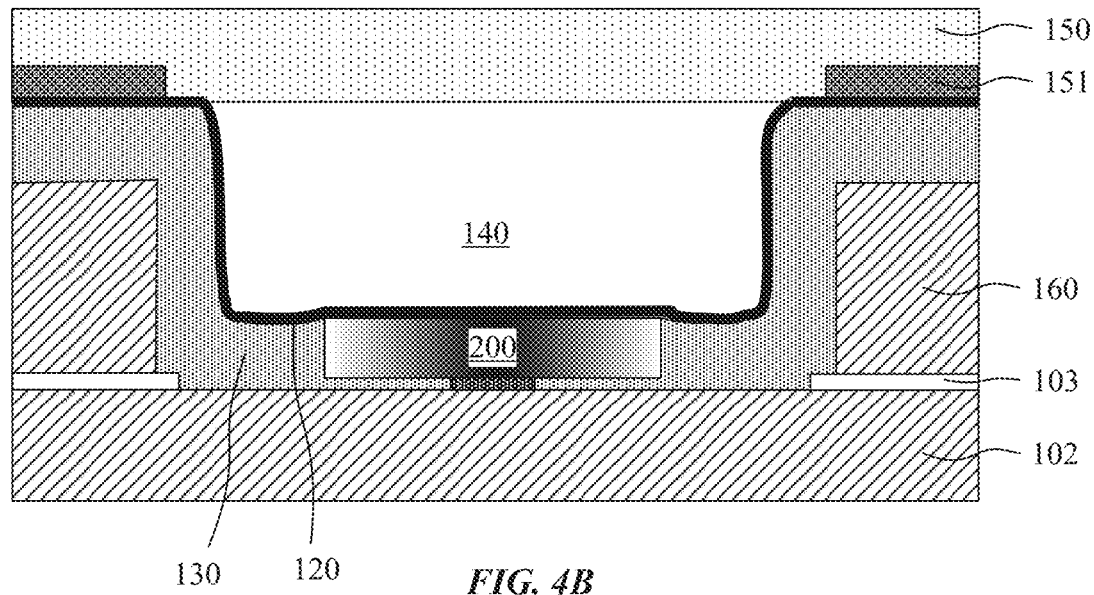
FIG. 4B is a close-up cross-sectional side view illustration of light emitting structure including a diffuser layer laterally adjacent to an LED within a well opening and spanning over the well structure in accordance with an embodiment.

In accordance with embodiments, the diffuser layer 130 may replace the sidewall passivation layer 110. FIG. 4A is a close-up cross-sectional side view illustration of light emitting structure including a void over a diffuser layer 130 and LED 200 in accordance with an embodiment. As illustrated, the diffuser layer 130 laterally surrounds the LED 200 within the well opening of the well structure 160. Additionally, the transparent electrode layer 120 is on and spans over the LED 200 and the diffuser layer 130. FIG. 4B is a close-up cross-sectional side view illustration similar to FIG. 4A, with the diffuser layer 130 layer laterally adjacent to the LED 200 within the well opening and spanning over the well structure.

Figure 5:
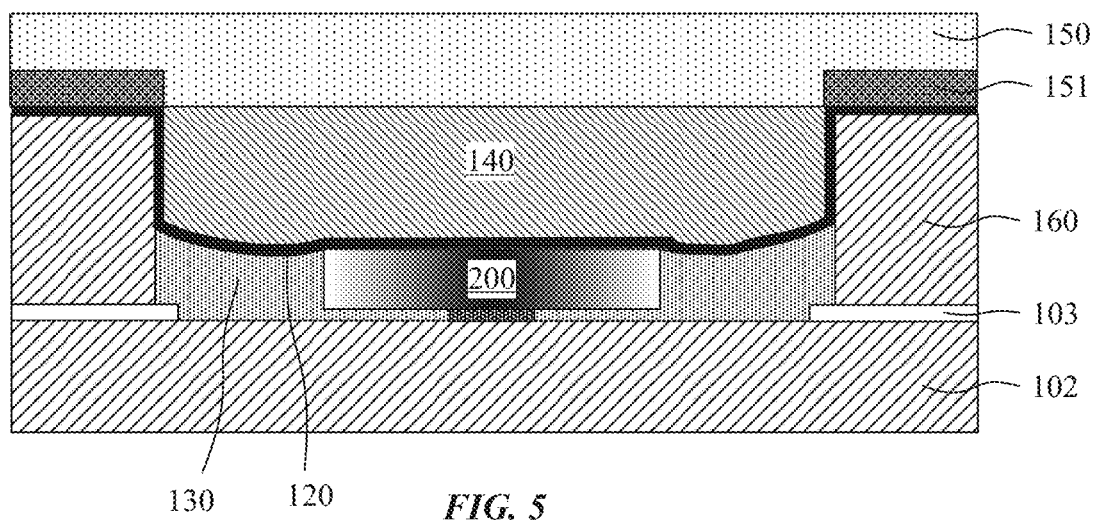
FIG. 5 is a close-up cross-sectional side view illustration of light emitting structure including a low index filler over an LED in accordance with an embodiment.

While the embodiments illustrated in FIGS. 2A-4B have illustrated the angular filter 140 as a void, embodiments are not so limited. For example, the angular filter may be a low index volume characterized by an index of refraction less than 1.1, such as a filler material, or a DBR layer. FIG. 5 is a close-up cross-sectional side view illustration of light emitting structure including a low index filler material as the angular filter 140 in accordance with an embodiment. For example, a low index filler material may be an array of randomly arranged dielectric nanocolumns or nanowires (refractive index of each ~1.5, diameter<50 nm) with void between them, such that the average index of refraction is less than 1.1. Alternatively, it may be a lithography-defined cellular structure with a void in each cell (such that average refractive index is less than 1.1). In the embodiment illustrated in FIG. 5, the low index filler material is formed over a diffuser layer 130, which laterally surrounds the LED 200. In an embodiment, the diffuser layer 130, in addition to including scattering particles, may be formed of the low index filler material. In an embodiment, the angular filter 140 and the diffuser layer 130 illustrated in FIG. 5 are the same.

Figure 6:
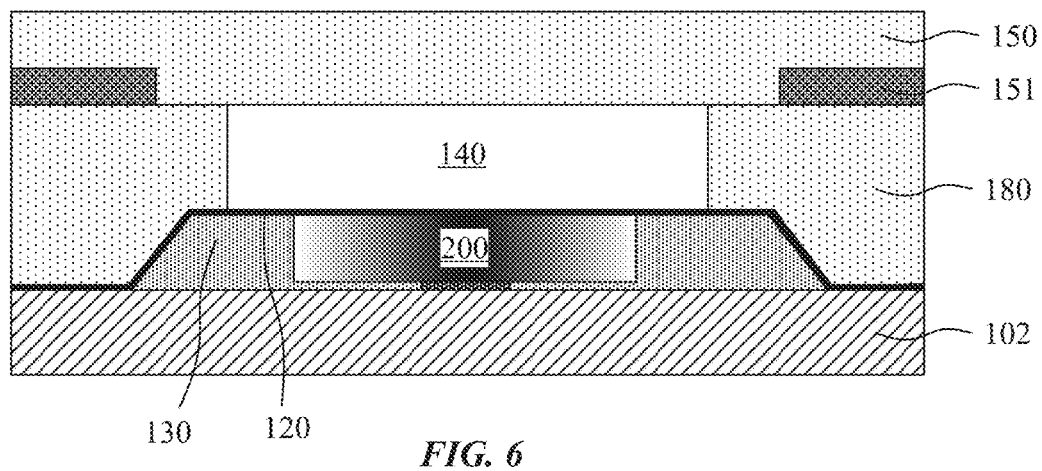
FIG. 6 is a close-up cross-sectional side view illustration of light emitting structure including a diffuser layer laterally adjacent to an LED in accordance with an embodiment.

While the embodiments illustrated in FIGS. 2A-5 have illustrated the light emitting structure as including a well structure with well opening, embodiments are not so limited. FIG. 6 is a close-up cross-sectional side view illustration of light emitting structure including a diffuser layer 130 that is laterally adjacent to, and laterally surrounds, an LED 200 in accordance with an embodiment. In accordance with embodiments, the diffuser layer 130 may be patterned with each subpixel, or may be a common layer across multiple different subpixels including LEDs 200 with different color emission. In an embodiment, the diffuser layer 130 is a common layer across the display area of the display substrate 102. Still referring to FIG. 6, the transparent electrode layer 120 is on and spans over the LED 200 and the diffuser layer 130. A spacer layer 180 including a spacer opening may optionally be formed over the LED 200 and diffuser layer 130. In an embodiment, the spacer layer 180 and spacer opening may provide spacing for the formation of a void to function as the angular filter 140.

Figure 7:
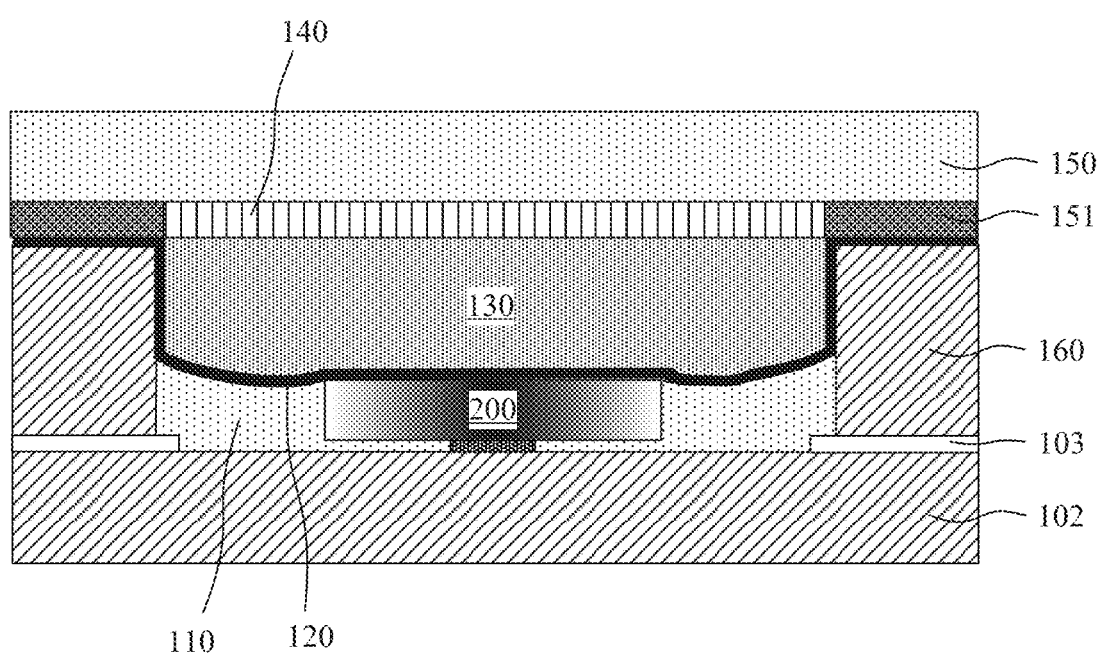
FIG. 7 is a close-up cross-sectional side view illustration of light emitting structure including a DBR layer over an LED in accordance with an embodiment.
Figure 8A:
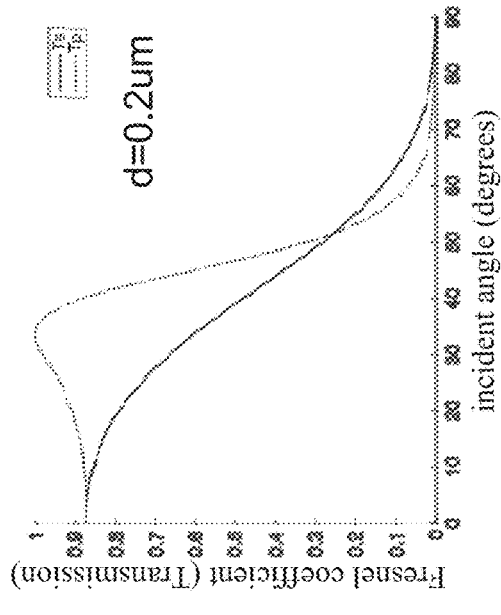
FIGS. 8A-8D are graphs of transmission versus incident angle for various void thicknesses in accordance with embodiments.
Figure 8B:
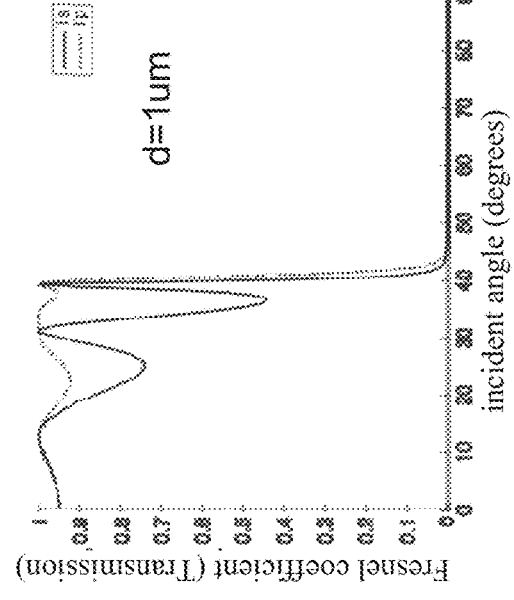
Figure 8C:
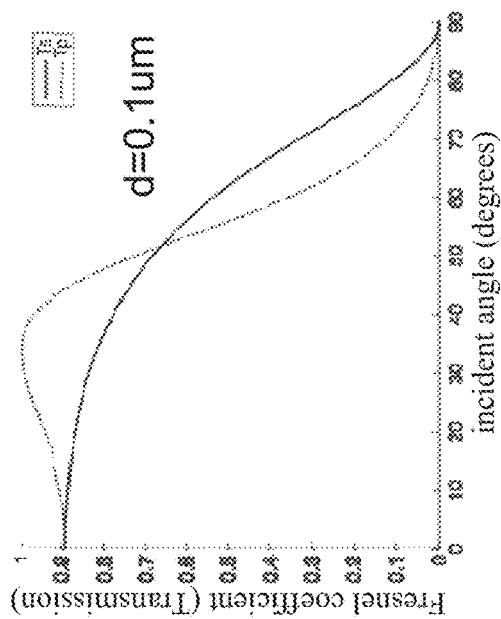
Figure 8D:
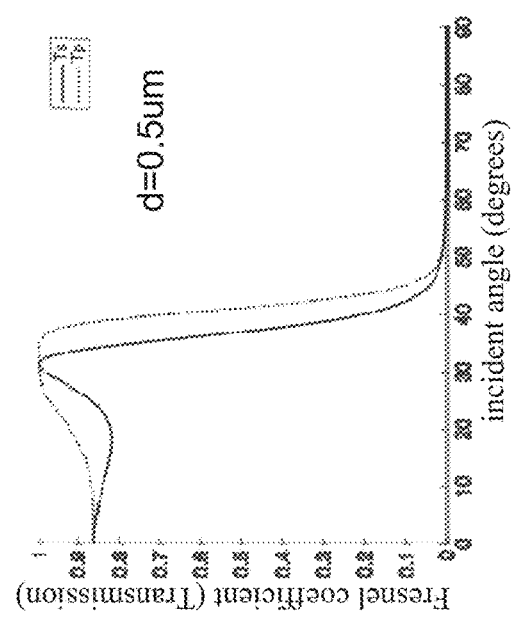

Until this point, the angular filter 140 has been illustrated as either a void or filler material. FIG. 7 is a close-up cross-sectional side view illustration of light emitting structure including a DBR layer as the angular filter 140 in accordance with an embodiment. In accordance with embodiments, the DBR layer is formed over the diffuser layer 130 and the LED 200, which may optionally be mounted on the display substrate 102 within a well opening of a well structure 160. In the particular embodiment illustrated the DBR layer is formed over the well structure 160. In other embodiments, the DBR layer may be formed over the diffuser layer 130 within the well structure 160. In an embodiment, the DBR layer may be included within the overcoat layer 150, though this is optional.

It is to be appreciated that embodiments include a variety of combinations of structures including a diffuser layer 130 and angular filter 140, and embodiments are not limited to the specific structures illustrated, and may include combinations of various features of the structures.

Simulation Example 1

In order to test the effectiveness of a void as an angular filter 140, simulation tests were run to calculate light transmission at 630 nm through the void and entering an overcoat layer 150 at different incident angles. While simulation results were performed at 630 nm, the results hold true for shorter wavelengths, and apply to the entire visible wavelength spectrum. The exemplary simulation structures include a diffuser layer 130 formed of PMMA with an index of refraction of 1.5, a void of variable thickness (d) over the diffuser layer 130, and an overcoat layer 150 formed over the void, the overcoat layer 150 also formed of PMMA with an index of refraction of 1.5. The diffuser layer 130 included approximately 3% by volume TiO$_2$ particle filler, with average particle size of 200 nm.

Results of the light transmission simulation are provided in FIGS. 8A-8D, where it is demonstrated that incident light is transmitted into the overcoat layer 150 at different ranges of incident angles as a function of void thickness (d). For example, the smallest void of 0.1 µm transmits light at a wider range of incident angles than the largest void of 1 µm. Specifically, the results show that at a void thickness of 0.5 µm and above, the light with a tilt angle greater than 42 degrees is reflected back, and only light in the escape cone angular range is transmitted. Accordingly, in accordance with embodiments, with a void of 0.5 µm or more, incident light with a tilt angle greater than 42 degrees is reflected back into the mixing cup region where the light can be scattered and reflected, increasing the chances of the light being transmitted within the escape cone angular range of 42 degrees or less. In this manner, the escape cone angular range of 42 degrees or less is within the range in which light will not be lost due to TIR in the overcoat layer.

Simulation Example 2

Similar to Simulation Example 1, light extraction simulation tests were run to quantify the amount of light extracted into the overcoat layer 150, with varying thicknesses of the underlying void. The exemplary simulation structures were similar to those in FIG. 4. Specifically, each simulation structure included a 0.5 µm thick PMMA diffuser layer 130 including approximately 3% by volume TiO$_2$ particle filler, with average particle size of 200 nm. Each well structure 160 was covered with an aluminum mirror layer 170 on all sides (similar to FIG. 2A). A black matrix layer 151 was formed over each well structure 160 with a 15 µm wide opening. A 20 µm thick overcoat layer 150 of PMMA was over the black matrix layer 151 and underlying well structure 160.

Figure 9:
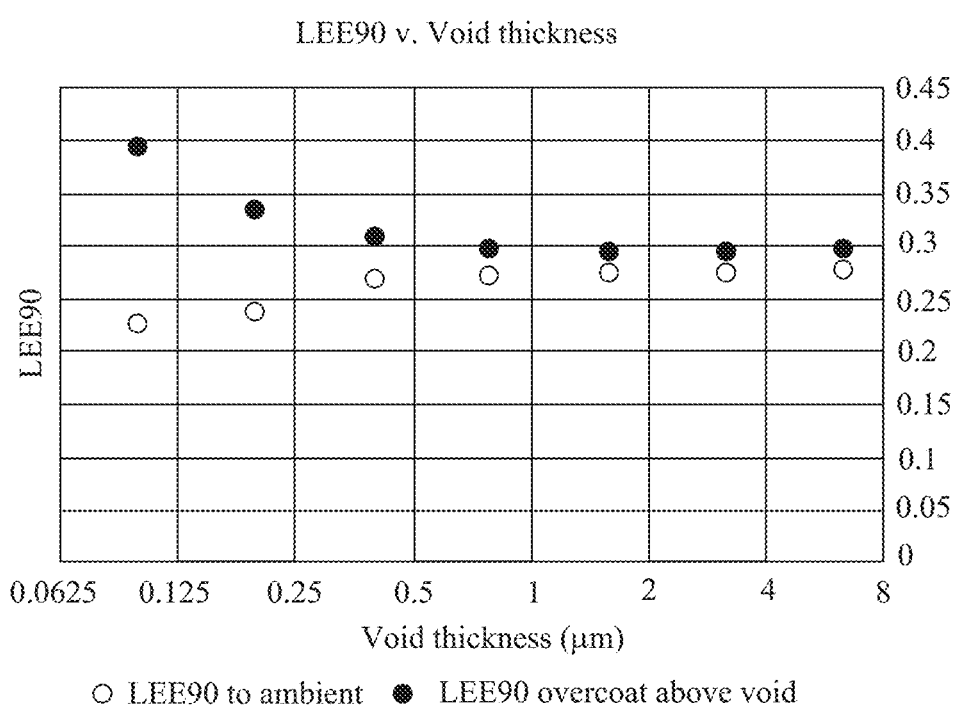
FIG. 9 is a graph of light extraction efficiency at 90 degrees versus void thickness in accordance with an embodiment.

Results of the simulation for light extraction efficiency into hemisphere, i.e. 0 to 90 degree viewing angle (LEE90) are provided in FIG. 9, where the filled circles indicate LEE90 into the overcoat layer 150 over the void, and the unfilled circles indicating LEE90 into ambient over the overcoat layer 150. As shown, LEE90 into ambient is shown to increase while LEE90 into the overcoat layer 150 is shown to decrease as the void thickness increases. This effect was demonstrated to level off at about a 0.5 µm void thickness. This effect can be attributed to TIR within the overcoat layer 150 below about 0.5 µm void thickness, and increasing effectiveness of the void as an angular filter up to about 0.5 µm. Thus, similar to Simulation Example 1, the results provide a lower limit of the void thickness, above which the ability of to filter light does not significantly increase.

Simulation Example 3

Figure 10A:
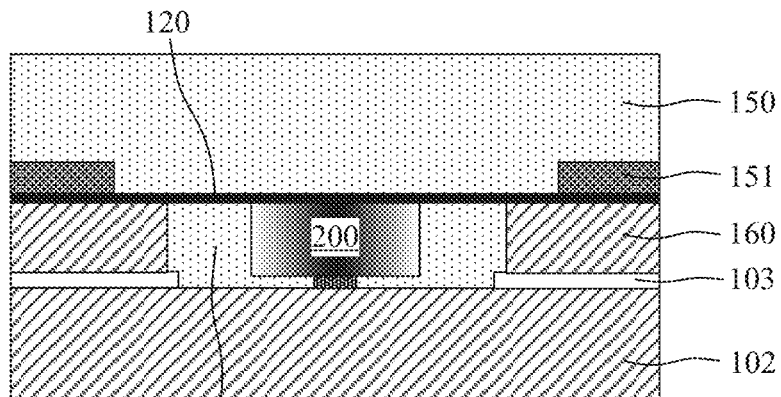
FIG. 10A is a close-up cross-sectional side view illustration of light emitting structure without a diffuser layer and void in accordance with an embodiment.
Figure 10B:
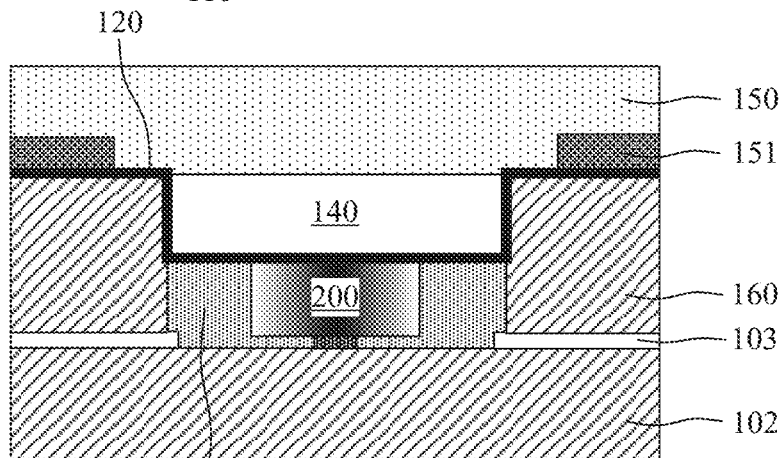
FIG. 10B is a close-up cross-sectional side view illustration of light emitting structure with a diffuser layer and void in accordance with an embodiment.
Figure 10C:
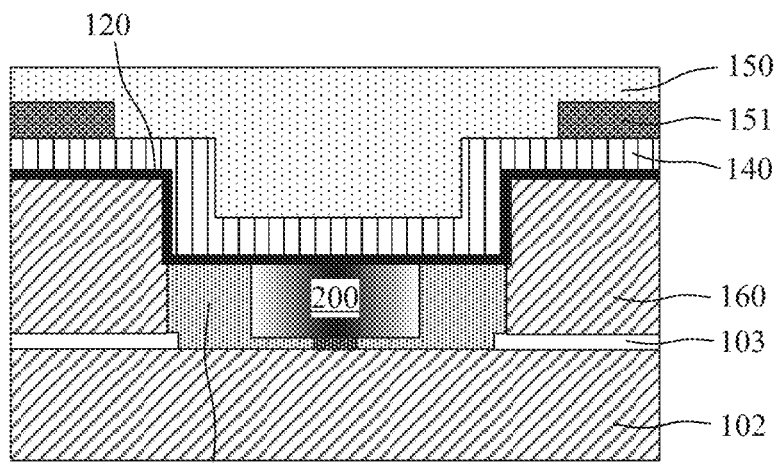
FIG. 10C is a close-up cross-sectional side view illustration of light emitting structure with a diffuser layer and distributed Bragg reflector layer in accordance with an embodiment.

Referring now to FIGS. 10A-10C, additional close-up cross-sectional side view illustrations are provided of simulation structures in accordance with embodiments. Specifically, FIG. 10A illustrates a baseline structure which does not include an angular filter 140 or diffuser layer 130. FIG. 10B illustrates a structure including a void as the angular filter 140 and an underlying diffuser layer 130. FIG. 10C illustrates a structure including a DBR layer as the angular filter 140 and an underlying diffuser layer 130. In each of the simulation structures of FIGS. 10A-10C, the diffuser layer 130 included a PMMA matrix with an index of refraction of 1.5 and 3% by volume TiO$_2$ filler with 200 nm average particle size. With regard to FIGS. 10A-10C, the exemplary LED 200 was selected for peak emission wavelength of 630 nm (red). With regard to FIG. 10B, the angular filter 140 void thickness was 1 µm. With regard to FIG. 10C, the angular filter was a DBR layer as provide in Table. 1.

TABLE 1

| Layer | thickness (nm) |
| --- | --- |
| TiO$_2$ | 133.22 |
| MgF$_2$ | 214.36 |
| TiO$_2$ | 127.56 |

TABLE 1-continued

| Layer | thickness (nm) |
|---|---|
| MgF$_2$ | 179.01 |
| TiO$_2$ | 139.13 |
| MgF$_2$ | 77.1 |
| TiO$_2$ | 140.49 |
| MgF$_2$ | 176.1 |
| TiO$_2$ | 133.9 |
| MgF$_2$ | 224.65 |
| TiO$_2$ | 138.3 |
| MgF$_2$ | 277.16 |
| TiO$_2$ | 142.17 |
| Total | 2103 |

Simulation tests were performed for the three simulation structures of FIGS. 10A-10C, to calculate light extraction efficiency in ambient for the stackups at both the 90 degree viewing angle (LEE90) and the 0 to 5 degree viewing angle (LEE05). Results of the simulation are provided in Table 2 below.

TABLE 2

| Simulation model | LEE90 | LEE05 |
|---|---|---|
| No angular filter, no diffuser layer | 18.6% | 0.17% |
| Void + diffuser layer | 27.9% | 0.25% |
| DBR + diffuser layer | 25.4% | 0.23% |

As shown in the simulation results provided in Table 2, both LEE90 and LEE05 are improved with the introduction of an angular filter and diffuser layer. It is believed LEE05 improvement may be attributed to introduction of the diffuser layer. Thus, the diffuser layer is understood to improve angular characteristics as well as LEE of the system. Additionally, simulation results demonstrate the effectiveness of the void and DBR layer angular filters for improving LEE, with the DBR layer performing almost as well as the void for both LEE90 and LEE05.

Simulation Example 4

Still referring to FIGS. 10A-10C, simulation structures of Simulation Example 4 are similar to those used for Simulation Example 3, with one difference being the diffuser layer 130 being formed of a high refractive index material. Specifically, diffuser layer 130 is formed of a polymer matrix loaded with Zr-oxide nanoparticles to achieve an index of refraction of 1.76, and additionally 3% by volume TiO$_2$ scattering particles with 200 nm average particle size. With regard to FIG. 10C, the angular filter was a DBR layer as provide in Table. 3.

TABLE 3

| Layer | thickness (nm) |
|---|---|
| TiO$_2$ | 129.77 |
| MgF$_2$ | 155.39 |
| TiO$_2$ | 118.57 |
| MgF$_2$ | 246.44 |
| TiO$_2$ | 125.32 |
| MgF$_2$ | 100.05 |
| TiO$_2$ | 135.19 |
| MgF$_2$ | 62.93 |
| TiO$_2$ | 136.53 |
| MgF$_2$ | 66.76 |
| TiO$_2$ | 142.37 |
| MgF$_2$ | 54.93 |

TABLE 3-continued

| Layer | thickness (nm) |
|---|---|
| TiO$_2$ | 147.24 |
| MgF$_2$ | 68.91 |
| TiO$_2$ | 129.43 |
| Total | 1819.83 |

Simulation tests were performed for the three simulation structures of FIGS. 10A-10C, to calculate light extraction efficiency in ambient for the stackups at both the 90 degree viewing angle (LEE90) and the 5 degree viewing angle (LEE05). Results of the simulation are provided in Table 4 below.

TABLE 4

| Simulation model | LEE90 | LEE05 |
|---|---|---|
| No angular filter, no diffuser layer | 21.3% | 0.15% |
| Void + diffuser layer | 27.5% | 0.26% |
| DBR + diffuser layer | 22.7% | 0.23% |

As shown in the simulation results provided in Table 4, demonstrate the same trends for LEE90 and LEE05 as provided in Table 2. The simulation data suggests that the DBR layer does not function as well as the void as an angular filter for LEE90, though a slightly super-Lambertian angle pattern was observed and LEE05 remained comparatively high.

In utilizing the various aspects of the embodiments, it would become apparent to one skilled in the art that combinations or variations of the above embodiments are possible for fabricating light emitting structure mixing cups. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A light emitting structure comprising:
    a light emitting diode (LED);
    a well structure, wherein the LED is bonded to a substrate within a well opening of the well structure;
    a passivation layer that laterally surrounds the LED within the well opening;
    a transparent electrode layer on a top side of the LED, and spanning over the passivation layer within the well opening and over a top surface of the well structure outside of the well opening;
    a diffuser layer directly over the LED, the passivation layer, and the transparent electrode layer within the well opening, the diffuser layer comprising scattering particles dispersed in a matrix;
    wherein the well structure completely laterally surrounds the LED within the well opening, and the well structure that completely laterally surrounds the LED is thicker than the passivation layer, the LED, and a portion of the diffuser layer within the well structure;
    an angular filter directly over the diffuser layer and the LED; and
    an overcoat layer directly over the angular filter, the LED, and the transparent electrode layer spanning over the top surface of the well structure outside of the well opening.

2. The light emitting structure of claim 1, wherein the angular filter is selected from the group consisting of a low index volume characterized by an index of refraction less than 1.1 and a distributed Bragg reflector (DBR) layer.

3. The light emitting structure of claim 1, wherein the angular filter is at least partially located within the well opening.

4. The light emitting structure of claim 1, wherein the diffuser layer is formed on a top surface of the well structure and within the well opening.

5. The light emitting structure of claim 1, wherein the diffuser layer is characterized by an index of refraction that is greater than an index of refraction of the overcoat layer.

6. The light emitting structure of claim 1, wherein the diffuser layer is characterized by an index of refraction that is less than an index of refraction of the overcoat layer.

7. The light emitting structure of claim 1, further comprising a mirror layer spanning sidewalls of the well opening.

8. The light emitting structure of claim 1, wherein the angular filter is a DBR layer.

9. The light emitting structure of claim 1, wherein the angular filter is a low index volume comprised of a void at least 0.5 µm thick.

10. The light emitting structure of claim 1, wherein the diffuser layer comprises a dispersion of scattering particles with an average particle size between 100 nm and 500 nm.

11. The light emitting structure of claim 1, wherein the diffuser layer is completely contained within the well opening.

12. The light emitting structure of claim 1, wherein a maximum lateral dimension between sidewalls of the LED is 1 to 300 µm.

13. The light emitting structure of claim 1, wherein a maximum lateral dimension between sidewalls of the LED is 1 to 20 µm.

14. The light emitting structure of claim 1, wherein the well structure is characterized by a depth that is greater than a height of the LED by 1-7 µm.

15. The light emitting structure of claim 14, wherein the depth of the well structure is 5-10 µm.

* * * * *